(12) United States Patent
Liaw et al.

(10) Patent No.: US 7,342,819 B2
(45) Date of Patent: Mar. 11, 2008

(54) METHODS FOR GENERATING A REFERENCE VOLTAGE AND FOR READING A MEMORY CELL AND CIRCUIT CONFIGURATIONS IMPLEMENTING THE METHODS

(75) Inventors: Corvin Liaw, Munich (DE); Heinz Hoenigschmid, Poecking (DE); Milena Dimitrova, Munich (DE); Michael Angerbauer, Palling (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/368,266

(22) Filed: Mar. 3, 2006

(65) Prior Publication Data

US 2007/0206402 A1    Sep. 6, 2007

(51) Int. Cl.
*G11C 11/00* (2006.01)
(52) U.S. Cl. .................. 365/148; 365/189.09; 365/210
(58) Field of Classification Search .................. 365/148
See application file for complete search history.

(56) References Cited

U.S. PATENT DOCUMENTS

| | | | | |
|---|---|---|---|---|
| 5,828,615 A | * | 10/1998 | Mukunoki et al. .......... | 365/210 |
| 6,392,918 B2 | * | 5/2002 | Braun et al. ................ | 365/145 |
| 6,985,375 B2 | * | 1/2006 | Baker ......................... | 365/148 |
| 6,985,383 B2 | * | 1/2006 | Tang et al. .................. | 365/171 |
| 6,999,345 B1 | * | 2/2006 | Park et al. ............. | 365/185.18 |
| 2003/0128812 A1 | | 7/2003 | Moore et al. | |

OTHER PUBLICATIONS

Symanczyk, R., et al., "Electrical Characterization of Solid State Ionic Memory Elements," Proceedings of the Non-Volatile Memory Technology Symposium 2003, 7 pages.

* cited by examiner

*Primary Examiner*—Tan T. Nguyen
(74) *Attorney, Agent, or Firm*—Dicke, Billig & Czaja PLLC (57) ABSTRACT

A method and a circuit configuration for generating a reference voltage in a resistive semiconductor memory includes generating a reference voltage by connecting together two bitlines having different voltages. This method for generating a reference voltage can be used in a method and in a circuit configuration for reading at least one memory cell of a resistive memory cell array in a semiconductor memory. The generated reference voltage and a voltage dependent on the content of a resistive memory cell are applied to an amplifier to determine the content of the memory cell. The content of the memory cell is determined dependent on a relationship between the reference voltage and the voltage dependent on the content of the memory cell.

26 Claims, 4 Drawing Sheets

METHODS FOR GENERATING A REFERENCE VOLTAGE AND FOR READING A MEMORY CELL AND CIRCUIT CONFIGURATIONS IMPLEMENTING THE METHODS

TECHNICAL FIELD

The invention relates in general to the field of semiconductor memories and, in particular, to circuits and methods useful for reading resistive memory cells.

BACKGROUND

A resistive memory cell is a writable memory element, for example a rewritable memory element, that can be programmed to have either a high impedance state or a low impedance state. One example of a semiconductor memory utilizing a particular type of a resistive memory cell is a conductive bridging random access memory (CBRAM).

To determine the impedance state of a resistive memory cell, it is conventional to precharge a bitline being read to a read voltage and to use a voltage source as a reference voltage. The wordline associated with the resistive memory cell on the bitline being read is then activated. If the memory cell has been programmed to have a high resistance state, the voltage on the bitline being read will remain at the precharged voltage, however, if the memory cell has been programmed to have a low resistance state, the voltage on the bitline being read will quickly charge or discharge towards the voltage potential present at the other terminal of the memory cell resistance. An amplifier provides an indication of the logic state of the memory cell dependent upon the relationship between the voltage on the bitline being read and the reference voltage.

SUMMARY OF THE INVENTION

A method and a circuit configuration for generating a reference voltage in a resistive memory includes generating a reference voltage by connecting together two bitlines having different voltages. This method for generating a reference voltage can be used in a method and in a circuit configuration for reading at least one memory cell of a resistive memory cell array in a semiconductor memory. The generated reference voltage and a voltage dependent on the content of a resistive memory cell are applied to an amplifier to determine the content of the memory cell. The content of the memory cell is determined dependent on a relationship between the reference voltage and the voltage dependent on the content of the memory cell.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Figure 1:
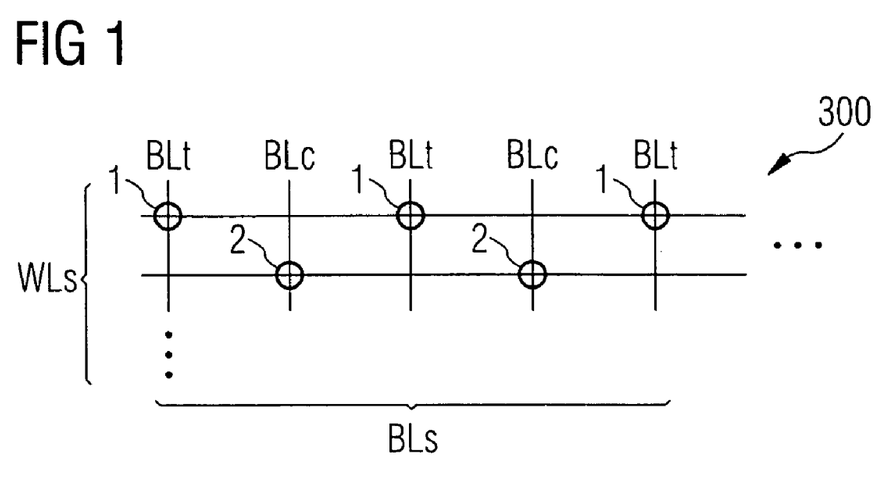
FIG. 1 is a schematic diagram showing an example of a memory cell array having resistive memory cells configured using a folded bitline architecture.

FIG. 1 shows an example of a memory cell array 300 having a plurality of resistive memory cells 1, 2 configured using a folded bitline architecture. Such resistive memory cells 1, 2 can be, but are not necessarily, conductive bridging random access memory cells. Many other types of resistive memory cells 1, 2 could be used. A phase change memory cell is an example of another type of resistive memory cell 1, 2 that could be used and the invention is not necessarily limited to being used with any one particular type of resistive memory cell 1, 2.

When a particular wordline is accessed in the folded bitline architecture, either every other bitline BLt is connected to a memory cell 1 or every other bitline BLc is connected to a memory cell 2, but memory cells 1 and 2 cannot both be accessed using the same wordline. All of the bitlines BLt connected to memory cells 1 will be referred to as being true bitlines BLt. All of the bitlines BLc connected to memory cells 2 will be referred to as being complementary bitlines BLc. This is just a convention used for explaining the invention and does not imply any differentiation in the structure or operation of the different bitlines BLt and BLc. One of ordinary skill in the art will understand that the pattern shown in FIG. 1 repeats so that additional memory cells 1 are connected to the true bitlines BLt and additional memory cells 2 are connected to the complementary bitlines BLc and, of course, additional wordlines WLs and bitlines BLs are also present.

When reading the memory cells 1, 2 in a folded bitline architecture, either memory cells 1 connected to the true bitlines BLt or memory cells 2 connected to the complementary bitlines BLc can be accessed at the same time while performing a read access; i.e., in one read cycle. It is preferable to use either a folded bit architecture or bit lines from different memory cell arrays when implementing the invention. This last point will become clear in the following explanation of two exemplary embodiments of the invention.

Figure 2:
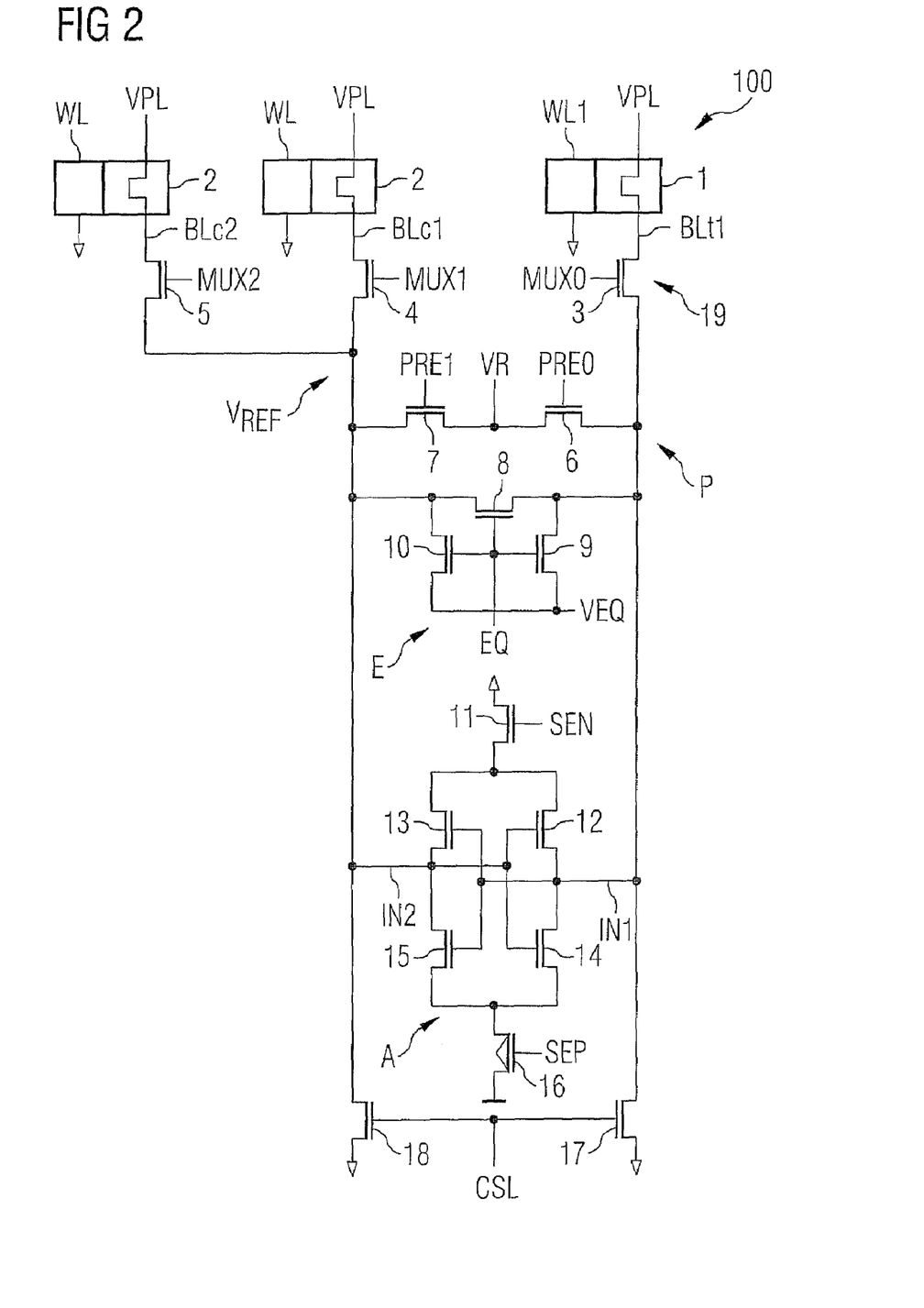
FIG. 2 is a schematic diagram showing a first exemplary embodiment of a circuit configuration for reading resistive memory cells.

FIG. 2 shows a first exemplary embodiment of a circuit configuration 100 for reading resistive memory cells 1, 2. A switching circuit 19 is formed by transistors 3, 4, and 5. The control signal MUX0 of transistor 3 is for coupling the bitline BLt1 to a first input IN1 of the sense amplifier A. The control signal MUX1 of transistor 4 is for coupling the bitline BLc1 to a second input IN2 of the sense amplifier A. The control signal MUX2 of transistor 5 is for coupling the bitline BLc2 to the second input IN2 of the sense amplifier A. Only bitlines of the same type BLt or BLc can be coupled with a given amplifier input of the sense amplifier A. In this example, IN1 can be coupled with a pair of true bitlines BLt's, however only BLt1 is shown, and IN2 can be coupled with the complementary bitlines BLc1 and BLc2. The sense amplifier A includes transistors 11-16 and will be activated by the control signals SEN and SEP. An equalizing circuit E is formed by transistors 8, 9, and 10, and a precharge circuit P is formed by transistors 6 and 7. Transistors 17 and 18 are simply used to provide the latched value of the sense amplifier to the periphery when the enable signal CSL (column select) is activated. In the following description it is assumed that the enable signal CSL is initially deactivated.

Each bitline BLt, BLc1, BLc2 has a line capacitance and a line resistance, which are not explicitly shown but are known to be physically present.

In the idle state, all of the bitlines (only BLt1, BLc1, and BLc2 are shown) are held at a voltage, which is typically VPL. This can be achieved by applying the control signal EQ to activate (make conductive) transistor 8, by setting the voltage at VEQ equal to VPL, and by applying appropriate control signals MUX0, MUX1, and MUX2 so that the bitlines BLt1, BLc1, and BLc2 are effectively shorted. VPL is the voltage applied to one electrode (e.g., the anode in a CBRAM memory cell) of the memory cells 1, 2 configured on the bitlines BLt, BLc. An example of a possible value of VPL is 1.5V. Of course the actual value of VPL used is dependent upon the type of resistive memory cells 1, 2 used and the particular circuit implementation.

An example of the method of generating a reference voltage $V_{ref}$ and of reading the cell content of a memory cell 1 on BLt1 will now be given. In the idle state, the bitlines BLt1, BLc1, and BLc2 have been set to the value of VPL. Any control signal sequence that will precharge only one of the complementary bitlines BLc1 or BLc2 to a suitable voltage, while leaving the other complementary bitline at the voltage of VPL will be acceptable for generating the reference voltage $V_{ref}$. It is preferable to precharge the true bitline BLt1 concurrently with precharging the one of the complementary bitlines BLc1 or BLc2 so that the memory cell 1 connected to the true bitline BLt1 can be read. The suitable voltage for precharging the true bitline BLt1 and only one of the complementary bitlines BLc1, BLc2 is preferably the read voltage $V_{read}$ used for precharging a bit line BLt (or BLc) in order to read the content from a memory cell 1 (or 2) connected to that bitline BLt (or BLc). $V_{read}$ can be, for example, $VPL-V_d$ (or correspondingly $VPL+V_d$). VPL, which is the voltage connected to one terminal of the memory resistance, could be, for example, 1.5V, and $V_d$ could be 100 mV, for example. It should be understood that these values are merely given as examples and many other suitable values could be used depending upon the particular resistive memory cells and circuit configuration being utilized in the semiconductor memory.

After the idle state, the control signal EQ is used to deactivate transistor 8 so that useful operations can be performed with the bitlines BLt1, BLc1, BLc2. In this example we will let the complementary bitline BLc2 remain at VPL by deactivating the control signal MUX2 so that transistor 5 disconnects complementary bitline BLc2. In order to precharge the true bitline BLt1 and the complementary bitline BLc1 to the read voltage $V_{read}$, the voltage $V_{read}$ is applied at VR and the control signals PRE0 and PRE1 are applied to activate transistors 6 and 7, respectively. The control signals MUX0 and MUX1 must also activate transistors 3 and 4, respectively. After a sufficient precharge time, the control signals PRE0 and PRE1 are used to deactivate transistors 6 and 7, respectively.

Now the reference voltage $V_{ref}$ can be generated as will be described. The control signal MUX2 is used to activate transistor 5 while MUX1 is activating transistor 4. In this manner, the second complementary bitline BLc2 is coupled to the first complementary bitline BLc1 and to the second input IN2 of the sense amplifier A. Charge sharing occurs between the first complementary bitline BLc1 and the second complementary bitline BLc2 and this charge sharing process generates a reference voltage $V_{ref}$ at the second input IN2 of the sense amplifier A. This reference voltage $V_{ref}$ will be midway between $V_{read}$ and VPL. $V_{ref}$ will equal 1.45V when using the exemplary values of $V_{read}$=1.4V and VPL=1.5V.

In order to read the content of the memory cell 1, MUX0 has preferably remained activated, and the wordline WL1 of the memory cell 1 to be read is activated, preferably at the same time that the control signal MUX2 activates transistor 5 to additionally couple the second complementary bitline BLc2 to the second input IN2 of the sense amplifier A. After a sufficient time for the charge sharing process on the complementary bitlines BLc1 and BLc2 and for the possible discharging or charging on true bitline Blt1, the control signals MUX0, MUX1, and MUX2 can be used to decouple all bitlines BLt1, BLc1, and BLc2 from the inputs IN1 and IN2 of the sense amplifier A, before the sense amplifier A is then activated using the control signals SEN and SEP so that the content of the memory cell 1 will be available. Decoupling the bitlines BLt1, BLc1, and BLc2 from the inputs IN1 and IN2 of the sense amplifier A eliminates the possibility that the memory cells 1, 2 could change memory state due to voltages and currents caused when the sense amplifier A is activated. For some resistive memory cells, e.g., for a PCRAM memory cell, the deactivation of the control signals MUX0, MUX1, and MUX2 can be omitted.

If the memory cell 1 being read has a high impedance state, the voltage applied to the first input IN1 of the sense amplifier A is the read voltage $V_{read}$ that was precharged onto the true bitline BLT1. If, however, the memory cell 1 has a low resistance state, the voltage applied to the first input IN1 of the sense amplifier A is essentially the voltage VPL connected to the resistance of the memory cell 1.

One advantage of the invention is that the reference voltage $V_{ref}$ generated will effectively compensate for variations in precharge times and in offset voltages. This enables a more aggressive timing to be implemented if desired. For example, if the first complementary bitline BLc1 were precharged to $VPL-V_d$ and the second complementary bitline was at VPL, then the voltage applied to the second input IN2 of the sense amplifier as a result of the charge sharing process would be: $[VPL-V_d+VPL]/2=VPL+0.5V_d$. This is highly desirable since the reference voltage $V_{ref}$ lies exactly between the two possible voltage values on the true bitline BLt1 being read, namely, the voltage VPL and the read voltage $V_{read}=VPL-V_d$. If however, the precharge time is too short, the bitlines BLc1 and BLt will only precharge to $VPL-80\% V_d$, and a voltage of $VPL-40\% V_d$ will result as a reference voltage $V_{ref}$. Note that this reference voltage $V_{ref}$ lies exactly between the now possible voltages ($VPL-80\% V_d$ and VPL) of the true bitline BLt to be evaluated. If the precharge voltage has an offset voltage, the reference voltage $V_{ref}$ will be analogously effected and the reference voltage $V_{ref}$ will now be equal to $VPL-0.5 (V_d+offset)$, which lies exactly between the voltages ($VPL-V_d+offset$) and VPL that are now possible on the true bitline BLt to be evaluated.

Another advantage of the invention is that an additional reference voltage source is not required since the reference voltage $V_{ref}$ generated at the second input IN2 of the sense amplifier A is derived by using the read voltage $V_{read}$.

The preceding explanation of the method of generating the reference voltage $V_{ref}$ and of reading the cell content of a memory cell was given by setting forth the procedure for reading a memory cell 1 that is connected to a true bitline BLt, specifically BLt1. For illustrating this case where a memory cell 1 is read on true bitline BLt1, it was not necessary to show a second true bitline BLt in FIG. 2. In implementing the invention, however, it should be possible to connect a second true bitline BLt (not shown in FIG. 2) to the input IN1 of the sense amplifier A.

An analogous procedure will be used for reading a memory cell 2 that is connected to a complementary bitline BLc1 or BLc2. In this case, two true bitlines BLt will be connected together to generate the reference voltage $V_{ref}$. The complementary bitline BLc1 or BLc2 to be read and one of the true bitlines BLt will have been precharged to a suitable voltage, for example, $VPL-V_d$ (or correspondingly $VPL+V_d$), and the other true bitline BLt will have been left at the initial voltage VPL obtained in the idle state. The non-illustrated second true bitline BLt would then be connected with the true bitline BLt1 to generate a reference voltage $V_{ref}$ that will be used when reading a memory cell 2 connected to a complementary bitline BLc1 or BLc2.

Additionally, a memory cell 1 connected to the non-illustrated true bitline BLt could be read. It should also be understood that the circuit configuration 100 would be constructed multiple times in a memory cell array 300 so that memory cells 1, 2 connected to all of the bitlines BLt, BLc could be read.

It should also now be clear why it is preferable to use either a folded bit architecture or complementary bit lines BLc (or true bitlines BLt in the other case) from a different memory cell array than the memory cell array containing a bitline BLt (or BLc in the other case) being read. The two bitlines BLc's (or BLt's) involved in the charge sharing process to generate the reference voltage $V_{ref}$ at the input IN2 (or IN1) of the sense amplifier A must not have a memory cell that will be accessed during the current read cycle. This enables the voltages on these bitlines to be set as desired so that the charge sharing process can then be utilized to generate the reference voltage $V_{ref}$.

A disadvantage of this first exemplary embodiment is that when disconnecting the bitlines BLt1, BLc1, BLc2 from the inputs IN1, IN2 of the sense amplifier A just before activating the sense amplifier A to read the content of the memory cell 1, the magnitude of the transient voltage produced at the second input IN2 of the sense amplifier A is much higher (approximately twice the magnitude) than the magnitude of the transient voltage produced at the first input IN1 of the sense amplifier A. Thus, a disturb signal results that may falsify the read signal. The difference in the transient voltages is caused because both switching transistors 4 and 5 are being disconnected from the second input IN2 of the sense amplifier A, while only switching transistor 3 is being disconnected from the first input IN1 of the sense amplifier A.

This disadvantage can be overcome by insuring that only one switching transistor (transistor 4, see FIG. 3) needs to make a transition in order to disconnect both complementary bitlines BLc1 and BLc2 from the second input IN2 of the sense amplifier A. Likewise, when reading a memory cell 2 connected to a complementary bitline BLc, only one switching transistor (transistor 3, see FIG. 3) will be used to disconnect two true bitlines (BLt1 and BLt2) from the first input IN1 of the sense amplifier A.

Figure 3:
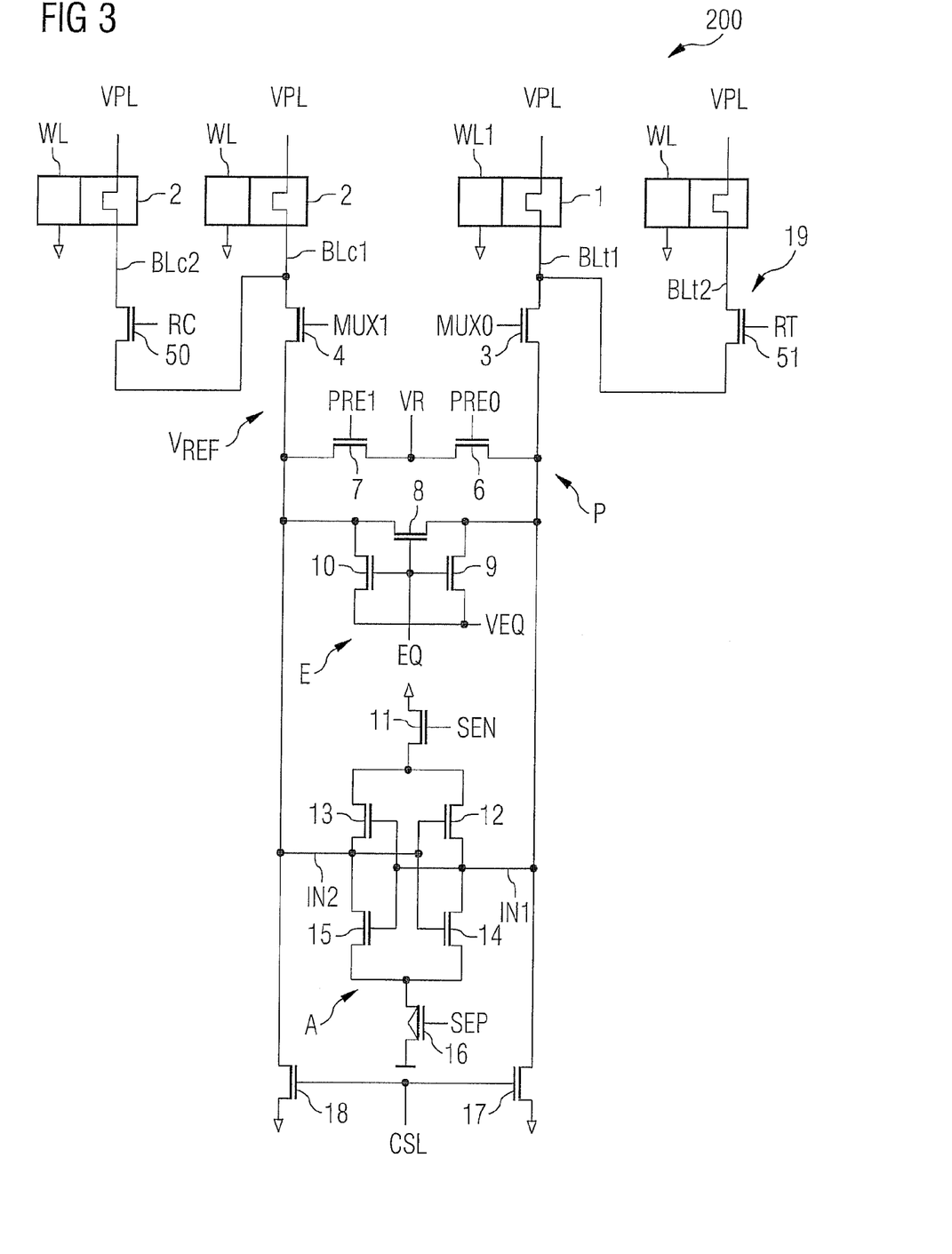
FIG. 3 is a schematic diagram showing a second exemplary embodiment of a circuit configuration for reading resistive memory cells.

FIG. 3 shows a second exemplary embodiment of a circuit configuration 200 for reading resistive memory cells 1, 2. Components that are similar to components shown in the first exemplary embodiment will be designated using the same reference numbers. Only additional or excluded components will be described in detail below. The second exemplary embodiment has been constructed to deal with the disadvantage of unequal switching transient voltages produced at the inputs IN1, IN2 of the sense amplifier A that was present in the first exemplary embodiment.

Note that an additional true bitline BLt2 is shown. It was not necessary to show BLt2 when describing the first embodiment. A switching circuit 19 is formed by transistors 3, 4, 50, and 51. Switching transistor 51 has been provided to connect the true bitlines BLt1 and BLt2 together using the control signal RT, while switching transistor 50 has been provided to connect the complementary bitlines together using the control signal RC. Again considering the situation in which the memory cell 1 connected to the true bitline BLt1 is to be read, one can see that switching transistor 50 can be used to connect the complementary bitlines BLc1 and BLc2 together so that the charge sharing process can occur. Now however, only transistor 4 has to be used to disconnect both complementary bitlines BLc1 and BLc2 from the second input IN2 of the sense amplifier A. Before activating the sense amplifier A, the control signal MUX1 deactivates transistor 4 to disconnect the complementary bitlines BLc1 and BLc2 from the second input IN2 of the sense amplifier A, while at the same time, control signal MUX0 deactivates transistor 3 to disconnect the true bitline BLt1, with the memory cell 1 being read, from the first input IN1 of the sense amplifier A. Since only a single transistor 3, 4 is undergoing a switching process on each input IN1, IN2 of the sense amplifier A and the transistors 3, 4 are operated symmetrically, the switching transient voltage produced at the second input IN2 will have about an equal magnitude to the switching transient voltage produced at the first input IN1 and this does not cause a disturb signal that will easily falsify the read signal. In this way the sense margin will be maximized.

An additional feature of the invention enables the equalizer circuit E including transistors 8, 9, and 10 to be eliminated from the circuit configuration 200 for reading resistive memory cells 1, 2. One example of a useful signal sequence for equalizing the bitlines BLt's and BLc's and for then reading the memory cell content 1 will now be described. Initially, the control signal RT activates transistor 51 to short together the true bitlines BLt1 and BLt2, and the control signal RC activates transistor 50 to short together the complementary bitlines BLc1 and BLc2. The control signals MUX0 and PRE0 are also activating transistors 3 and 6, respectively, so that the true bitlines BLt1 and BLt2 are held at the voltage VPL (1.5V in this example) applied by the signal VR (VR=VPL). The control signals MUX1 and PRE1 are activating transistors 4 and 7, respectively, so that the complementary bitlines BLc1 and BLc2 are also held at the voltage VPL applied by the signal VR. Now all bitlines BLt1, BLt2, BLc1, and BLc2 are equalized.

This equalization condition is kept during the idle state. For a read operation, the control signal RC and RT will deactivate transistor 50 and 51 so that the complementary bitline BLc2 will remain at the voltage VPL. Next, the voltage applied to VR is set to the read voltage $V_{read}$ (1.4V in this example). Now with the active control signals MUX0, MUX1, PRE0, and PRE1, the true bitline BLt1 and the complementary bitline BLc1 can be precharged to the read voltage $V_{read}$ applied at VR. After a sufficient time for the precharging operation, the control signals PRE0 and PRE1 are deactivated. Now, the control signal RC can be activated so that transistor 50 will connect the complementary bitlines BLc1 and BLc2 together to generate the reference voltage $V_{ref}$ on the second input IN2 of the sense amplifier A. The wordline WL1 is activated after a precharge of the bitline to be read so that a voltage dependent upon the content of the memory cell 1 will develop at the first input IN1 of the sense amplifier A. Now the control signals, MUX0 and MUX1 can deactivate transistors 3 and 4, respectively so that the true bitline BLt1 with the memory cell 1 being read and the complementary bitlines BLc1 and BLc2 are disconnected from the inputs IN1, IN2 of the sense amplifier A. Subsequently, the control signals SEN and SEP can activate the sense amplifier A to read the content of the memory cell 1 by comparing the reference voltage $V_{ref}$ that was applied to second input IN2 with the voltage dependent on the content of the memory cell 1 that was applied to first input IN1.

Figure 4:
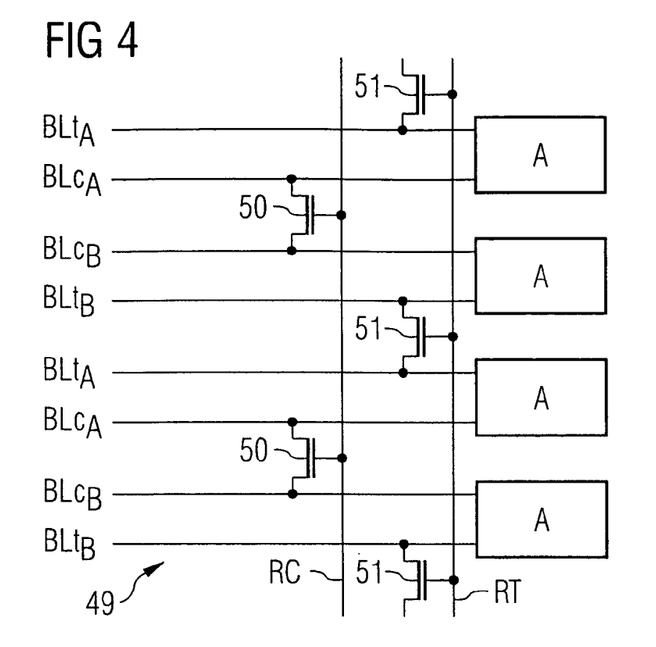
FIG. 4 is a schematic diagram showing a portion of a memory cell array.

FIG. 4 shows a portion of a memory cell array 49 having transistors 50 that can be used to connect two complementary bitlines BLc1 and BLc2 together. Although not shown in FIG. 4, another switching transistor (transistor 4, see FIG. 3) will be configured between each of the switching transistors 50 and their respective sense amplifier A. Likewise transistors 51 can be used to connect two true bitlines BLt together, and corresponding switching transistors (transistor 3, see FIG. 3) will be configured between the switching transistors 51 and their respective sense amplifier A.

Figure 5:
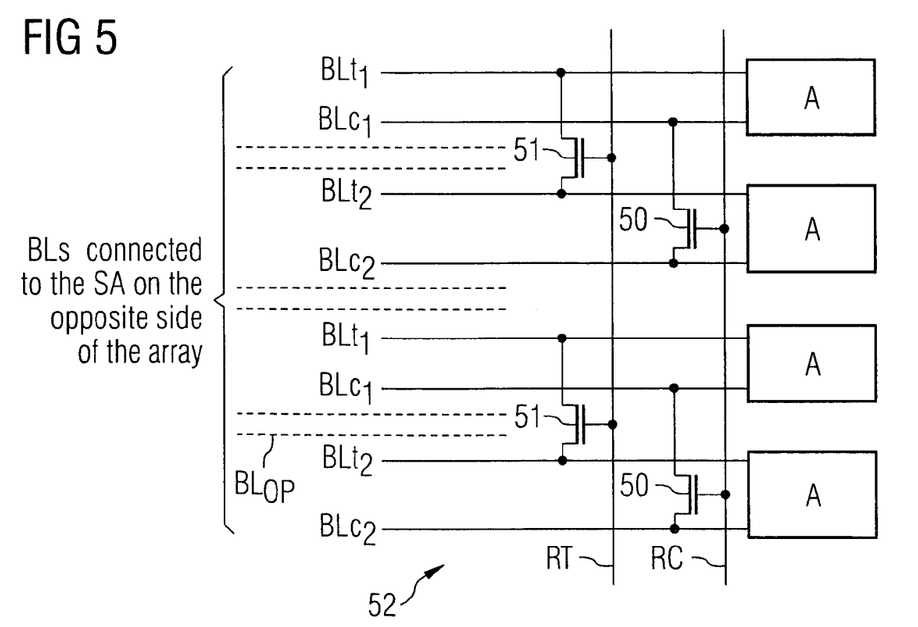
FIG. 5 is a schematic diagram showing a portion of another memory cell array.

FIG. 5 shows a portion of another memory cell array 52 having the transistors 50 and 51. It can be seen that the bitlines Blt1 and BLt2 or BLc1 and BLc2 being connected do not have to be directly adjacent bitlines. The dashed lines represent bitlines BLop connected to sense amplifiers located at the opposite side of the array 52. It can, therefore, be seen that even bitlines BLop connected to sense amplifiers located at the opposite side of the array 49 can be located between the bitlines BLt1 and BLt2 (for example) being connected by a transistor 51.

What is claimed is:

1. A method for operating a memory device, comprising:
   setting one of the two bitlines to a first voltage dependent on a voltage used to precharge a plurality of bitlines connected to a plurality of resistive memory cells to be read;
   setting another one of the two bitlines to a second voltage dependent on a voltage supplied to a plurality of resistances of the plurality of resistive memory cells; and
   generating a reference voltage in a resistive memory of the memory device, including connecting together the two bitlines having the first and second voltages.

2. The method according to claim 1, wherein the resistive memory comprises a resistive semiconductor memory.

3. The method according to claim 1, wherein setting another one of the two bit lines comprises setting the other one of the two bitlines to the second voltage during an idle state of the resistive memory.

4. The method according to claim 1, wherein setting one of the two bit lines comprises setting the one of the two bitlines to the first voltage concurrently with precharging the plurality of bitlines connected to the plurality of resistive memory cells to be read.

5. The method according to claim 4, wherein setting another one of the two bit lines comprises setting the other one of the two bitlines to the second voltage during the idle state of the resistive memory.

6. The method according to claim 1, wherein:
   the first voltage comprises the voltage used to precharge the plurality of bitlines; and
   the second voltage comprises the voltage supplied to the plurality of resistances of the plurality of resistive memory cells.

7. A method for reading at least one memory cell of a resistive memory cell array in a memory, the method comprising:
   setting one of the two bitlines to a first voltage dependent on a voltage used to precharge a bitline connected to the resistive memory cell in order to read the resistive memory cell;
   setting another one of the two bitlines to a second voltage dependent on a voltage supplied to a side of a resistance of the resistive memory cell that is opposite a side connected to the bitline being precharged; and
   generating a reference voltage by coupling together two bitlines having different voltages while not accessing a plurality of resistive memory cells connected to either of the two bitlines; and
   applying the reference voltage and a voltage dependent on a content of the resistive memory cell to an amplifier to determine the content of the resistive memory cell dependent on a relationship between the reference voltage and the voltage dependent on the content of the resistive memory cell.

8. The method according to claim 7, wherein setting another one of the two bitlines comprises setting the other one of the two bitlines to the second voltage during an idle state of the memory.

9. The method according to claim 7, wherein setting one of the two bitlines comprises setting the one of the two bitlines to the first voltage concurrently with precharging the bitline connected to the resistive memory cell.

10. The method according to claim 9, wherein setting another one of the two bit lines comprises setting the other one of the two bitlines to the second voltage during the idle state of the memory.

11. The method according to claim 7, wherein:
    the first voltage is the voltage used to precharge the bitline connected to the resistive memory cell in order to read the resistive memory cell; and
    the second voltage is the voltage supplied to the side of the resistance of the resistive memory cell that is opposite the side connected to the bitline being precharged.

12. The method according to claim 7, wherein the resistive memory cell comprises a conductive bridging random access memory cell.

13. The method according to claim 7, wherein:
    the resistive memory cell array includes a plurality of transistors for shorting respective pairs of bitlines together; and
    connecting together two bitlines comprises using one of the plurality of transistors to connect together the two bitlines.

14. The method according to claim 7, wherein:
    the resistive memory cell array includes a plurality of first bitlines connected to a plurality of resistive memory cells storing a plurality of memory contents not being accessed in a current read cycle; and
    the resistive memory cell away includes a plurality of second bitlines connected to the plurality of resistive memory cells storing a plurality of memory contents not being accessed in the current read cycle;
    the method comprising:
    generating a plurality of reference voltages by connecting the plurality of first bitlines, which each have a first voltage, to the plurality of second bitlines, which each have a second voltage; and
    applying the plurality of reference voltages and a plurality of voltages dependent on a plurality of memory cell contents of a plurality of resistive memory cells to a plurality of amplifiers to determine the plurality of memory cell contents of the plurality of resistive memory cells dependent on a plurality of relationships between the plurality of reference voltages and the plurality of voltages dependent on the plurality of memory cell contents.

15. A method for reading at least one memory cell of a resistive memory cell array in a memory, the method comprising:
generating a reference voltage by coupling together the two bitlines having different voltages while not accessing a plurality of resistive memory cells connected to either of the two bitlines; and
applying the reference voltage and a voltage dependent on a content of the resistive memory cell to an amplifier to determine the content of the resistive memory cell dependent on a relationship between the reference voltage and the voltage dependent on the content of the resistive memory cell, wherein:
applying the reference voltage to the amplifier comprises connecting the two bitlines to a first input of the amplifier; and
applying the voltage dependent on the content of the resistive memory cell comprises connecting a bitline, which is connected to the resistive memory cell, to a second input of the amplifier; the method further comprising: before activating the amplifier, deactivating only one transistor to disconnect the two bitlines from the first input of the amplifier and deactivating only one transistor to disconnect the bitline, which is connected to the resistive memory cell, from the first input of the amplifier.

16. A circuit comprising:
a resistive memory cell array that includes a plurality of bitlines, each one of the pairs of the plurality of bitlines includes a first bitline and a second bitline;
a first plurality of switching transistors coupled between the plurality of bitlines and a plurality of voltage nodes, wherein the first plurality of switching transistors is switchable to a first switching path for setting a first voltage on the first bitline of each one of the pairs of the plurality of bitlines and to a second switching path for setting a second voltage on the second bitline of each one of the pairs of the plurality of bitlines; and
a second plurality of switching transistors, each of the switching transistors of the second plurality coupled between a pair of the plurality of bitlines such that the bitlines of the pair can be coupled together to generate a reference voltage.

17. The circuit according to claim 16, wherein the resistive memory cell ail-ay comprises a resistive semiconductor memory.

18. The method according to claim 16, wherein:
the plurality of voltage nodes comprises a first voltage node for carrying a first voltage and a second voltage node for carrying a second voltage;
the first voltage is dependent on a voltage used to precharge a plurality of bitlines connected to a plurality of resistive memory cells to be read; and
the second voltage is dependent on a voltage supplied to a plurality of resistances of the plurality of resistive memory cells.

19. A circuit comprising:
a plurality of resistive memory cells;
a plurality of bitlines coupled to the plurality of resistive memory cells;
a plurality of amplifiers for reading the plurality of resistive memory cells, the plurality of amplifiers including a plurality of first inputs and a plurality of second inputs, the plurality of amplifiers capable of being activated and deactivated;
a switching circuit for selectively coupling the plurality of bitlines to the plurality of first inputs and to the plurality of second inputs of the plurality of amplifiers; and
a precharge circuit for selectively precharging the plurality of bitlines, the precharge circuit cooperating with the switching circuit; wherein:
the switching circuit and the precharge circuit are controlled for setting a first voltage on a first group of the plurality of the bitlines and for setting a second voltage on a second group of the plurality of bitlines;
the switching circuit is controlled for generating a plurality of reference voltages by connecting the first group of the plurality of the bitlines and the second group of the plurality of bitlines to the plurality of second inputs of the plurality of amplifiers;
the switching circuit is controlled for connecting a third group of the plurality of bitlines to the plurality of first inputs of the plurality of amplifiers, the third group of the plurality of bitlines connected to a group of the plurality of resistive memory cells to be read;
the switching circuit is controlled for disconnecting the first group of the plurality of the bitlines and the second group of the plurality of bitlines from the plurality of second inputs and for disconnecting the third group of the plurality of bitlines from the plurality of first inputs before the plurality of amplifiers are activated to determine a plurality of resistive states of the group of the plurality of resistive memory cells to be read; and
the resistive semiconductor memory is constructed so that the plurality of reference voltages can be generated without adversely effecting a memory cell read cycle.

20. The circuit configuration according to claim 19, wherein:
the switching circuit includes a first plurality of transistors and a second plurality of transistors;
wherein one of the first plurality of transistors of the switching circuit is for disconnecting only one bitline selected from the first group of the plurality of the bitlines and for disconnecting only one bitline selected from the second group of the plurality of the bitlines from a respective one of the plurality of second inputs; and
each one of the second plurality of transistors of the switching circuit is for disconnecting only one bitline selected from the third group of the plurality of the bitlines from a respective one of the plurality of second inputs.

21. The circuit configuration according to claim 19, wherein the switching circuit and the precharging circuit cooperate to equalize the plurality of the bitlines.

22. The circuit configuration according to claim 19, wherein the resistive memory cell array of the resistive semiconductor memory is constructed with a folded bitline architecture so that the plurality of reference voltages can be generated without adversely effecting a memory cell read cycle.

23. The circuit configuration according to claim 19, wherein
the plurality of the resistive memory cells include a plurality of resistances connected to a voltage equal to the second voltage; and
the first voltage is obtained from a read precharging voltage.

24. A memory circuit comprising:

memory cell array means for storing contents, the memory cell array means including a plurality of resistive memory cells for storing the contents and a plurality of bitlines connected to the plurality of memory cells;

precharging means for setting a plurality of voltages on the plurality of bitlines;

means for generating a plurality of reference voltages by connecting pairs of the plurality of bitlines together;

amplification means for determining the contents stored by the plurality of memory cells by comparing each of the plurality of reference voltages with a respective one of a plurality of voltages dependent on the contents stored by ate plurality of resistive memory cells; and switching means for applying the plurality of reference voltages and the plurality of voltages dependent on the contents stored by the plurality of memory cells to the amplification means, the switching means cooperating with the precharging means for setting the plurality of voltages on the plurality of bitlines.

25. The circuit configuration according to claim 24, wherein the precharging means equalizes the plurality of bitlines.

26. The circuit configuration according to claim 24, wherein the plurality of voltages set by the precharging means includes a voltage equal to a read voltage and a voltage connected to the plurality of resistive memory cells.

* * * * *